(12) United States Patent
Onishi et al.

(10) Patent No.: US 6,586,801 B2
(45) Date of Patent: Jul. 1, 2003

(54) SEMICONDUCTOR DEVICE HAVING BREAKDOWN VOLTAGE LIMITER REGIONS

(75) Inventors: Yasuhiko Onishi, Nagano (JP); Tatsuhiko Fujihira, Nagano (JP); Susumu Iwamoto, Nagano (JP); Takahiro Sato, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/845,747

(22) Filed: May 1, 2001

(65) Prior Publication Data

US 2001/0052601 A1 Dec. 20, 2001

(30) Foreign Application Priority Data

May 1, 2000 (JP) ........................ 2000-132252

(51) Int. Cl.[7] ................. H01L 29/76; H01L 29/94; H01L 31/062; H01L 31/113; H01L 31/119

(52) U.S. Cl. ............................................ 257/339

(56) References Cited

U.S. PATENT DOCUMENTS 4,754,310 A * 6/1988 Coe ............................ 357/13
5,216,275 A * 6/1993 Chen ......................... 257/493
5,438,215 A   8/1995 Tihanyi ...................... 257/401
5,635,743 A * 6/1997 Takahashi ................... 257/343
5,744,826 A * 4/1998 Takeuchi et al. ............. 257/77
5,864,159 A * 1/1999 Takahashi ................... 257/330
6,081,009 A * 6/2000 Neilson ...................... 257/341

* cited by examiner

Primary Examiner—Amir Zarabian
Assistant Examiner—Monica Lewis
(74) Attorney, Agent, or Firm—Rossi & Associates

(57) ABSTRACT

A semiconductor device facilitates preventing hot carriers from being injected into the insulation film so that the characteristics and the reliability of the active region thereof may not be impaired. The device includes an alternating-conductivity-type drain including heavily doped p-type breakdown voltage limiter regions in the portions of p-type partition regions in contact with the well bottoms of p-type base regions. Since the electric field in the central portion of breakdown voltage limiter regions reaches the critical value in advance to the electric field at the points E beneath gate insulation films the electric field at the points E is relaxed and hot carrier injection into gate insulation films is prevented.

10 Claims, 12 Drawing Sheets

US 6,586,801 B2

SEMICONDUCTOR DEVICE HAVING BREAKDOWN VOLTAGE LIMITER REGIONS

FIELD OF THE INVENTION

The present invention relates to a semiconductor structure applicable to semiconductor devices, such as MOSFET's (insulated gate field effect transistors), IGBT's (insulated gate bipolar transistors), bipolar transistors and diodes. More specifically, the present invention relates to a semiconductor structure, which facilitates realizing a high breakdown voltage and a high current capacity in a power semiconductor device.

BACKGROUND OF THE INVENTION

Semiconductor devices may be classified into lateral devices, wherein the main electrodes thereof are on one major surface, and vertical devices that distribute the main electrodes thereof on two major surfaces facing opposite to each other. In the vertical semiconductor device, a drift current flows in the thickness direction of the semiconductor chip (vertically) in the ON-state of the semiconductor device and depletion layers expand also in the thickness direction of the semiconductor chip (vertically) in the OFF-state of the semiconductor device.

FIG. 14 is a cross sectional view of a conventional planar-type n-channel vertical MOSFET (vertical double-diffused MOSFET). Referring now to FIG. 14, the MOSFET includes an $n^+$-type layer 11 with low electrical resistance, a drain electrode 18 in electrical contact with $n^+$-type layer 11, an $n^-$-type drain drift layer 12 with high electrical resistance on $n^+$-type layer 11, p-type base regions (p-type well regions) 13 formed selectively in the surface portion of $n^-$-type drain drift layer 12, $n^+$-type source regions 14 and a heavily doped $p^+$-type contact region 19 formed selectively in the surface portion of p-type base region 13, a polycrystalline silicon gate electrode layer 16 above the extended portion of p-type base region 13 extended between $n^+$-type source region 14 and $n^-$-type drain drift layer 12 with a gate insulation film 15 interposed therebetween, and a source electrodes 17 in contact commonly with $n^+$-type source regions 14 and $p^+$-type contact regions 19.

In the vertical MOSFET as described above, highly resistive $n^-$-type drain drift layer 12 provides a vertical drift current path in the ON-state thereof. Since highly resistive $n^-$-type drain drift layer 12 is biased at a reverse bias potential in the OFF-state of the MOSFET, $n^-$-type drain drift layer 12, depleted by the depletion layers expanding from the pn-junctions between p-type base regions 13 and $n^-$-type drain drift layer 12, provides the MOSFET with a high breakdown voltage. Thinning highly resistive $n^-$-type drain drift layer 12, (that is, shortening the drift current path), facilitates reducing the on-resistance (the resistance between the drain and the source), since the drift resistance in the ON-state of the semiconductor device is reduced. However, the thinning, highly resistive $n^-$-type drain drift layer 12 narrows the width between the drain and the base, in that depletion layers expand from the pn-junctions between p-type base regions 13 and $n^-$-type drain drift layer 12. Due to the narrow expansion width of the depletion layers, the depletion electric field strength soon reaches the maximum (critical) electric field strength for silicon. Therefore, breakdown is caused at a voltage between the drain and the source lower than the designed breakdown voltage. A high breakdown voltage is obtained by thickening $n^-$-type drain drift layer 12. However, a thick $n^-$-type drain drift layer 12 with high resistance inevitably causes high on-resistance, and that further increases loss. In other words, there exists a tradeoff relationship between the on-resistance (current capacity) and the breakdown voltage. The tradeoff relationship between the on-resistance and the breakdown voltage also exists in other semiconductor devices such as IGBT's, bipolar transistors and diodes, which have a drift layer.

European Patent 0 053 854, U.S. Pat. No. 5,216,275, U.S. Pat. No. 5,438,215, Japanese Unexamined Laid Open Patent Application H09-266311 and Japanese Unexamined Laid Open Patent Application H10-223896 disclose semiconductor devices, which facilitate reducing the tradeoff relation between the on-resistance and the breakdown voltage. The vertical drift sections of the semiconductor devices are formed of an alternating conductivity type layer including heavily doped n-type regions and heavily doped p-type regions alternately arranged.

FIG. 15 is a cross sectional view of a vertical MOSFET disclosed in U.S. Pat. No. 5,216,275. Referring now to FIG. 15, the vertical MOSFET disclosed in the above identified U.S. patent includes a drain drift layer 22, that is not a uniform impurity diffusion layer of one conductivity type but an alternating conductivity type layer formed of n-type drift current path regions 22a and p-type partition regions 22b arranged alternately. The n-type drift current path regions 22a and p-type partition regions 22b are shaped with respective layers extending vertically. Since depletion layers expand laterally from the vertically extending pn-junctions between n-type drift current path regions 22a and p-type partition regions 22b in the OFF-state of the MOSFET, the entire drain drift layer 22 is depleted. In other words, a thick depletion layer is obtained in the OFF-state of the MOSFET. Therefore, the vertical MOSFET shown in FIG. 15 facilitates obtaining a high breakdown voltage even when the impurity concentrations in n-type drift current path regions 22a and p-type partition regions 22b are high. Hereinafter, the semiconductor device including an alternating conductivity type layer, that provides a current path in the ON-state of the device and is depleted in the OFF-state of the device, will be referred to as the "super-junction semiconductor device".

Alternating-conductivity-type drain drift layer 22 beneath the active region—including p-type base regions 13—facilitates realizing a higher breakdown voltage. However, alternating-conductivity-type drain drift layer 22 poses another problem on the super-junction semiconductor device described above. During the transition from the ON-state to the OFF-state, a strong electric field tends to remain beneath gate insulation film 15 due to the well curvature of p-type base regions 13. In the super-junction semiconductor device, depletion layers expand very quickly from the pn-junctions between p-type base regions 13 and drift current path regions 22a and from the pn-junctions between drift current path regions 22a and p-type partition regions 22b into drift current path regions 22a, causing an instantaneous pinching effect. The instantaneous pinching effect accelerates carrier ejection from drift current path regions 22a and hot carrier injection into gate insulation films 15. Due to the accelerated hot carrier injection, the deterioration of gate insulation films 15 lowers the threshold voltage, which further impairs the characteristics and the reliability of the active region of the device.

In the conventional semiconductor device which does not include any alternating-conductivity-type drain drift layer, and/or depletion layers expanding from p-type base regions 13 toward the layer with low electrical resistance 11, separate carriers from gate insulation film 15. Since depletion layers expand all at once in the super-junction semiconductor device, the accumulated carriers have no place to escape. The ejected carriers encounter the strong electric field beneath gate insulation film 15, causing hot carriers, which will be injected into gate insulation film 15. Although depletion layers expand quickly in the vicinity of p-type base regions 13 doped lightly, lightly doped p-type base regions 13 directly affect the threshold voltage.

The problems described above occur not only in the vertical double-diffused MOSFET's, but also in other vertical super-junction semiconductor devices such as vertical IGBT's, vertical bipolar transistors and vertical diodes, which include an insulation film on the active region. In view of the foregoing, it would be desirable to provide a super-junction semiconductor device that facilitates in preventing hot carriers from being injected into the insulation film so that the characteristics and the reliability of the active region thereof will not be impaired.

SUMMARY OF THE INVENTION

The present invention obviates the problems described above by intentionally disposing sacrifice regions outside the active region for making the electric field strengths in the sacrifice regions reach the maximum (critical) value in advance to the electric field strength in the portions beneath the gate insulation films so that strong electric fields may not be caused beneath the gate insulation films.

According to the present invention, there is provided a semiconductor device including: a semiconductor chip having a first major surface and a second major surface facing opposite to the first major surface; a first main electrode on the first major surface; a second main electrode on the second major surface; an active region in electrical contact with the first main electrode; a layer with low electrical resistance in electrical contact with the second main electrode; an alternating-conductivity-type layer between the active region and the layer with low electrical resistance; the alternating-conductivity-type layer including first semiconductor path regions of a first conductivity type and second semiconductor regions of a second conductivity type; the first semiconductor regions and the second semiconductor regions being arranged alternately; and the alternating-conductivity-type layer further including breakdown voltage limiter regions of the second conductivity type for making the electric field strength thereof reach the critical value prior to the electric field strength in the active region.

Since breakdown is caused in the breakdown voltage limiter regions, the electric fields thereof reach the critical value prior to the electric field beneath the first major surface, and a strong electric field is not caused beneath the first major surface. Also, hot carrier injection to the first major surface is prevented from causing. Therefore, the characteristics and the reliability of the active region in the super-junction semiconductor device according to the invention, which exhibit a high breakdown voltage and a high current capacity, are not impaired.

The breakdown voltage limiter regions may be of the first conductivity type and formed in the respective first semiconductor regions. However, the hot carriers caused at the location spaced apart from the first major surface by breakdown may hit the first major surface when the breakdown voltage limiter regions are in the respective first semiconductor regions. Therefore, it is preferable to form the breakdown voltage limiter regions in the respective second semiconductor regions. The breakdown voltage limiter region is formed preferably in any location in the partition region such as the location in the vicinity of the active region and the location spaced apart from the active region.

The performance of the breakdown voltage limiter region is defined by the impurity amount therein, which is a product of the width and also the impurity concentration of the breakdown voltage limiter region. Advantageously, the impurity amount in the breakdown voltage limiter region will be higher than the impurity amount in an adjacent first conductivity type region of the second semiconductor region.

Although the breakdown voltage is reduced when the width of the breakdown voltage limiter region is equal to the width of the first conductivity type region and the impurity concentration in the breakdown voltage limiter region is higher than the impurity concentration in the first conductivity type region, on-resistance increase is prevented from causing. Since the reduction of the breakdown voltage is not so large as the addition of the breakdown voltage obtained by employing the alternating-conductivity-type layer, the breakdown voltage of the super-junction semiconductor device according to the invention is still higher than the breakdown voltage of the conventional semiconductor device, which does not employ any alternating-conductivity-type layer. On-resistance increase is caused when the breakdown voltage limiter region is wider than the first conductivity type region and the impurity concentration in the breakdown voltage limiter region is equal to the impurity concentration in the first conductivity type region, since the first semiconductor regions are pinched. Since the increment of the on-resistance is not so large as the decrement of the on-resistance obtained by employing the alternating-conductivity-type layer, the on-resistance of the super-junction semiconductor device according to the invention is still lower than the on-resistance of the conventional semiconductor device which does not employ any alternating-conductivity-type drain drift layer. The on-resistance is slightly increased by setting the impurity concentration and the width of the breakdown voltage limiter region larger than the impurity concentration and the width of the first conductivity type region, respectively.

Advantageously, the planar pattern of the first semiconductor regions and the second semiconductor regions is a laminate formed of the stripes of the first semiconductor regions and the stripes of the partition regions alternately arranged.

Advantageously, the first semiconductor regions and the second semiconductor regions are shaped with respective columns arranged at the lattice points of a planar lattice.

Alternatively, the first semiconductor regions or the second semiconductor regions are shaped with walls forming a honeycomb.

Advantageously, the active region constitutes a double-diffused MOSFET structure, a diode junction stricture, a bipolar transistor structure and such a semiconductor structure.

BRIEF DESCRIPTION OF THE DRAWINGS

The invention will now be described in greater detail with reference to certain preferred embodiments thereof along with the accompanying drawings wherein.

DETAILED DESCRIPTION OF THE PREFERRED EMBODIMENTS

In the following descriptions, the n-type layer or the n-type region is a layer or a region; therein electrons are majority carriers. The p-type layer or the p-type region is a layer or a region; therein holes are majority carriers. The suffix "+" on the right shoulder of the letter "n" or "p" indicating the conductivity type of the layer or the region indicates the relevant region or the layer is doped relatively heavily. The suffix "−" on the right shoulder of the letter "n" or "p" indicating the conductivity type of the layer or the region indicates the region or the layer is doped relatively lightly.

First Embodiment

Figure 1:
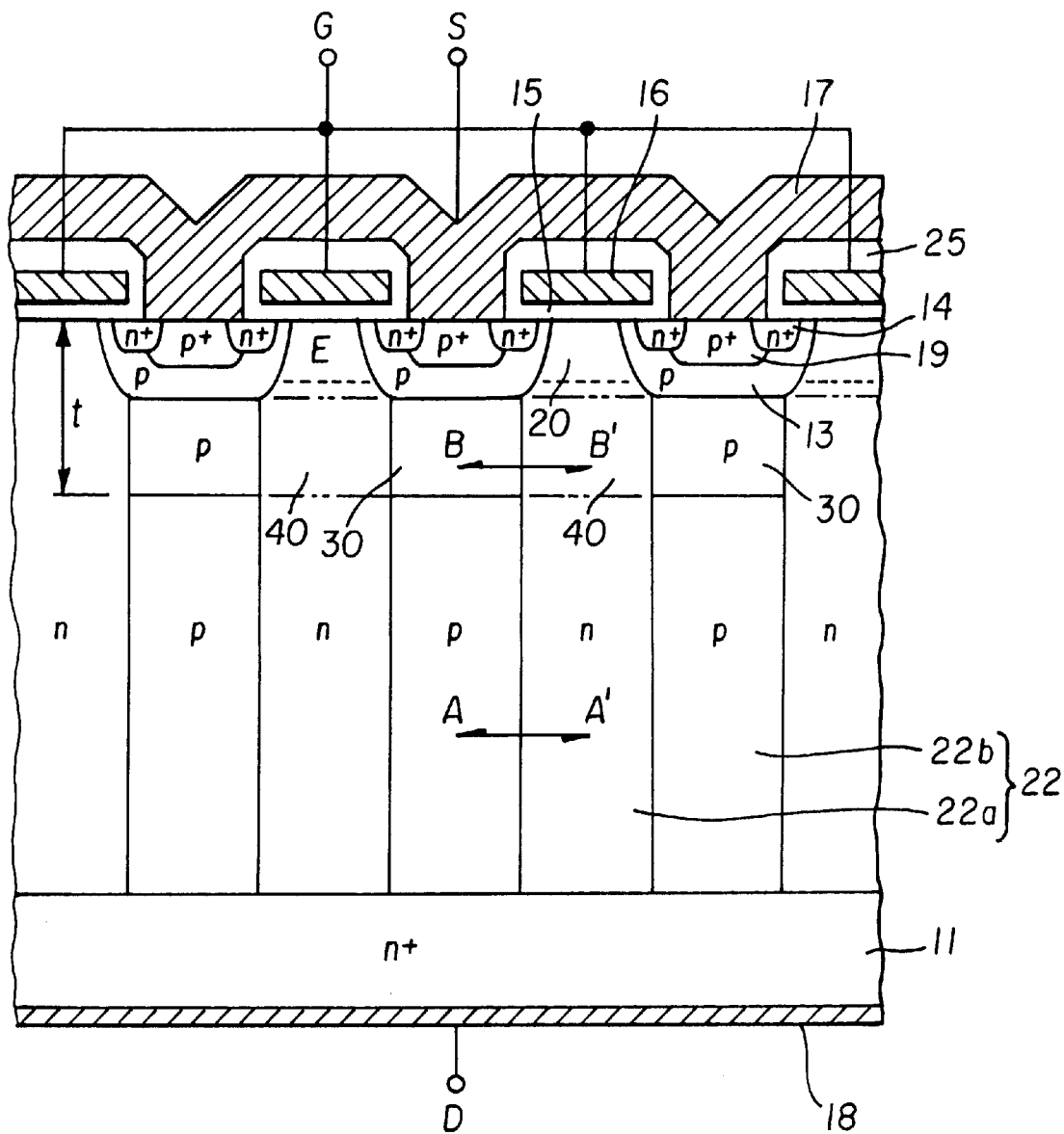
FIG. 1 is across sectional view of a vertical MOSFET according to a first embodiment of the invention.
Figure 15:
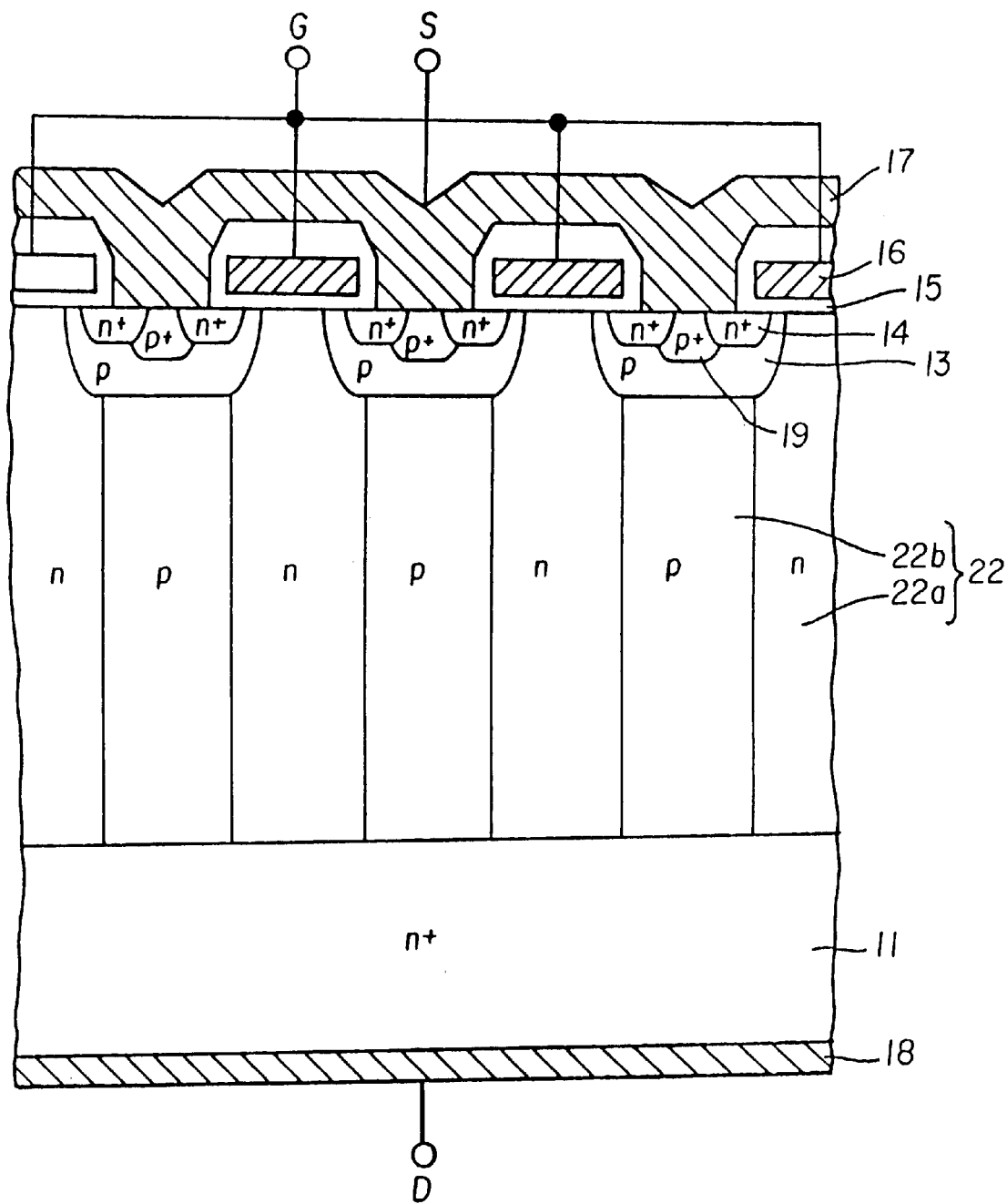
FIG. 15 is a cross sectional view of a vertical MOSFET disclosed in U.S. Pat. No. 5,216,275.

FIG. 1 is a cross sectional view of a vertical MOSFET according to the first embodiment of the invention. In FIG. 1, the same reference numerals as used in FIG. 15 are used to designate the same constituent elements and their duplicated explanations are omitted for the sake of simplicity. Referring now to FIG. 1, the vertical MOSFET according to the first embodiment includes an $n^+$-type drain layer with low electrical resistance (contact layer) 11; a drain electrode 18 in electrical contact with $n^+$-type drain layer 11; an alternating-conductivity-type drain drift layer 22 on $n^+$-type contact layer 11; heavily doped p-type base regions (p-type well regions) 13 formed selectively in the surface portion of drain drift layer 22, p-type base regions 13 constituting the active region of the MOSFET; heavily doped $n^+$-type source regions 14 formed selectively in the surface portion of p-type base region 13; a $p^+$-type contact region 19 formed selectively in the surface portion of p-type base region 13; a polycrystalline silicon gate electrode layer 16 above the extended portion of p-type base region 13 extended between $n^+$-type source region 14 and drain drift layer 22 with a gate insulation film 15 interposed therebetween; and a source electrode 17 in electrical contact with p-type base regions 13 and $n^+$-type source regions 14 via through holes bored in an interlayer insulation film 25. The $n^+$-type source regions 14 are formed shallowly in well-shaped p-type base regions 13, resulting in a double-diffused MOS structure. Although not illustrated, metal film gate wiring is in electrical contact with gate electrode layer 16.

Laminating n-type epitaxial layers on $n^+$-type drain layer 11 as a substrate forms alternating-conductivity-type drain drift layer 22. Alternating-conductivity-type drain drift layer 22 is a thick laminate formed of vertically extending, layer-shaped n-type drift current path regions 22a and vertically extending, layer-shaped p-type partition regions 22b alternately laminated laterally. In the top plan view, stripes of n-type drift current path regions 22a and stripes of p-type partition regions 22b are arranged alternately and extending in parallel to each other. According to the first embodiment, the impurity concentrations in n-type drift current path regions 22a and p-type partition regions 22b are equal to each other. The widths of n-type drift current path regions 22a and p-type partition regions 22b are almost equal to each other. Alternatively, n-type drift current path regions 22a and p-type partition regions 22b may be shaped with respective columns located at the lattice points of a planar lattice. In a further embodiment, n-type drift current path regions 22a or p-type partition regions 22b may be arranged like walls forming a honeycomb.

The upper end of n-type drift current path region 22a is in contact with a channel region (the region between p-type base regions 13) 20 beneath gate insulation film 15. The lower ends of n-type drift current path regions 22a are in contact with $n^+$-type drain layer 11. The upper end of p-type partition region 22b is in contact with the well bottom of p-type base region 13. The lower ends of p-type partition regions 22b are in contact with $n^+$-type drain layer 11.

A p-type breakdown voltage limiter region 30 is formed in the upper end portion of p-type partition region 22b in contact with the well bottom of p-type base region 13. The lower level of p-type breakdown voltage limiter region 30 is at the depth t of 10 $\mu$m from the surface of the semiconductor chip. The p-type breakdown voltage limiter region 30 is doped more heavily than the other portion of p-type partition region 22b. Therefore, p-type breakdown voltage limiter region 30 is doped more heavily than opposite conductivity type regions 40 corresponding to the portions of adjacent n-type drift current path regions 22a in contact with p-type breakdown voltage limiter region 30.

Figure 2:
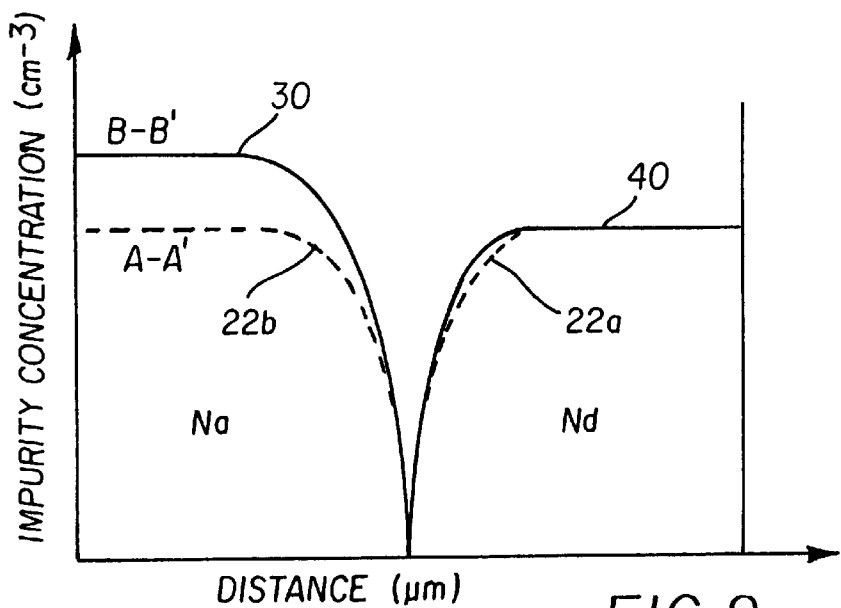
FIG. 2 shows the distribution profiles of the impurity concentration along the cross sections A-A' and B-B' of FIG. 1.

FIG. 2 shows the distribution profiles of the impurity concentration along the cross sections A-A' and B-B' of FIG. 1. Referring now to FIG. 2, the impurity concentration in breakdown voltage limiter region 30 is higher than the impurity concentration in opposite conductivity type region 40.

Figure 3:
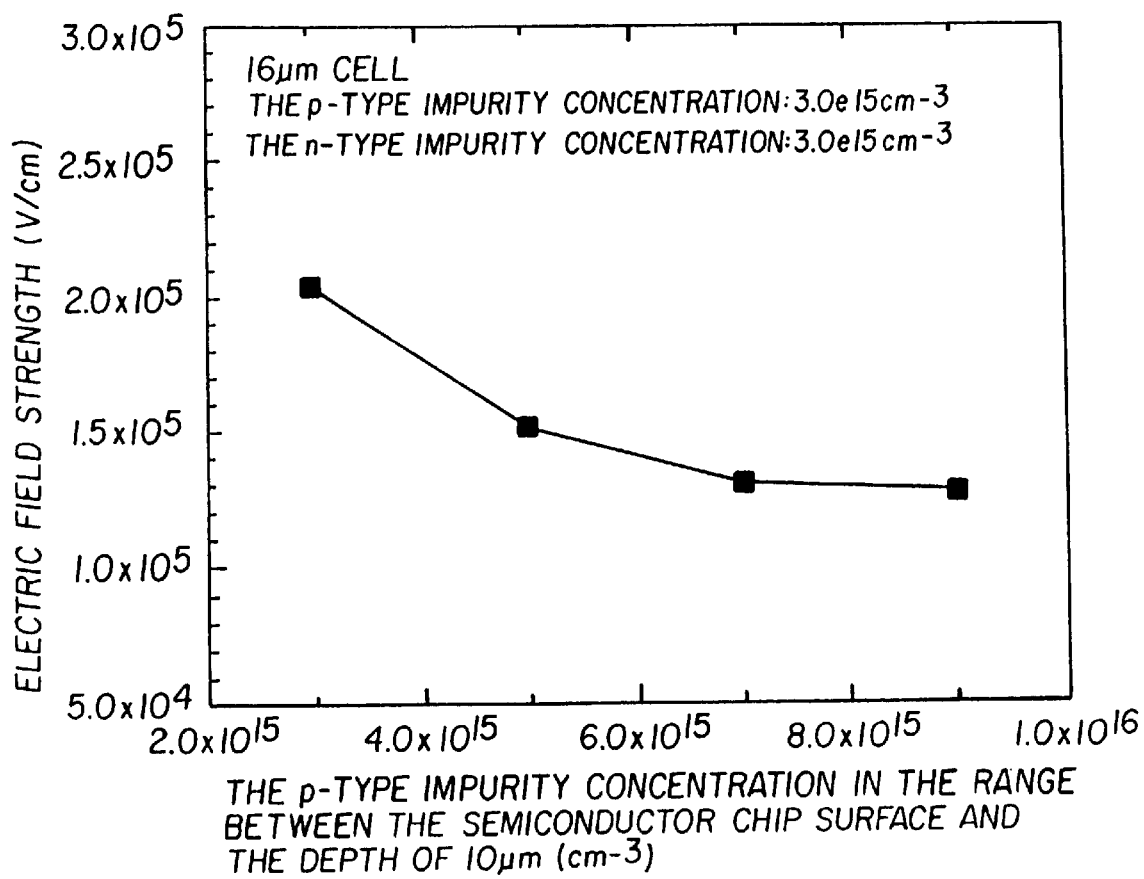
FIG. 3 is a graph simulating the relation between the electric field strength at the point E beneath the gate insulation film and the impurity concentration in the breakdown voltage limiter region.

FIG. 3 is a graph simulating the relation between the electric field strength at the point E beneath the gate insulation film and the impurity concentration of breakdown voltage limiter region 30 (the range between the semiconductor chip surface and the depth of 10 $\mu$m). The pitch of repeating, thereat a pair of drift current path region 22a and p-type partition region 22b is repeated in alternating-conductivity-type drain drift layer 22 is 16 $\mu$m. The widths of drift current path regions 22a and p-type partition regions 22b are almost uniform in the depth direction of the semiconductor chip. The impurity concentrations in alternating-conductivity-type drain drift layer 22, with the exception of breakdown voltage limiter regions 30, are $3\times10^{15}$ cm$^{-3}$. The thickness of alternating-conductivity-type drain drift layer 22 is 50 $\mu$m. As FIG. 3 indicates, the electric field at the point E is further relaxed as the impurity concentration in breakdown voltage limiter regions 30 is increased. The electric field at the point E beneath the gate insulation film saturates at the impurity concentration of around $7.0\times10^{15}$ cm$^{-3}$. Since the depletion layer of the breakdown voltage limiter regions 30 is hardly extended and then the electric field in the breakdown limiter regions reaches the critical electric field in advance to the electric field at the point E beneath the gate insulator film, the electric field at the point E is relaxed. Breakdown hardly occurs in the vicinity of the point E, and hot carrier injection into the gate insulation films is prevented from causing. Therefore, the characteristics and the reliability of the active region in the super-junction semiconductor device are not impaired.

Figure 4:
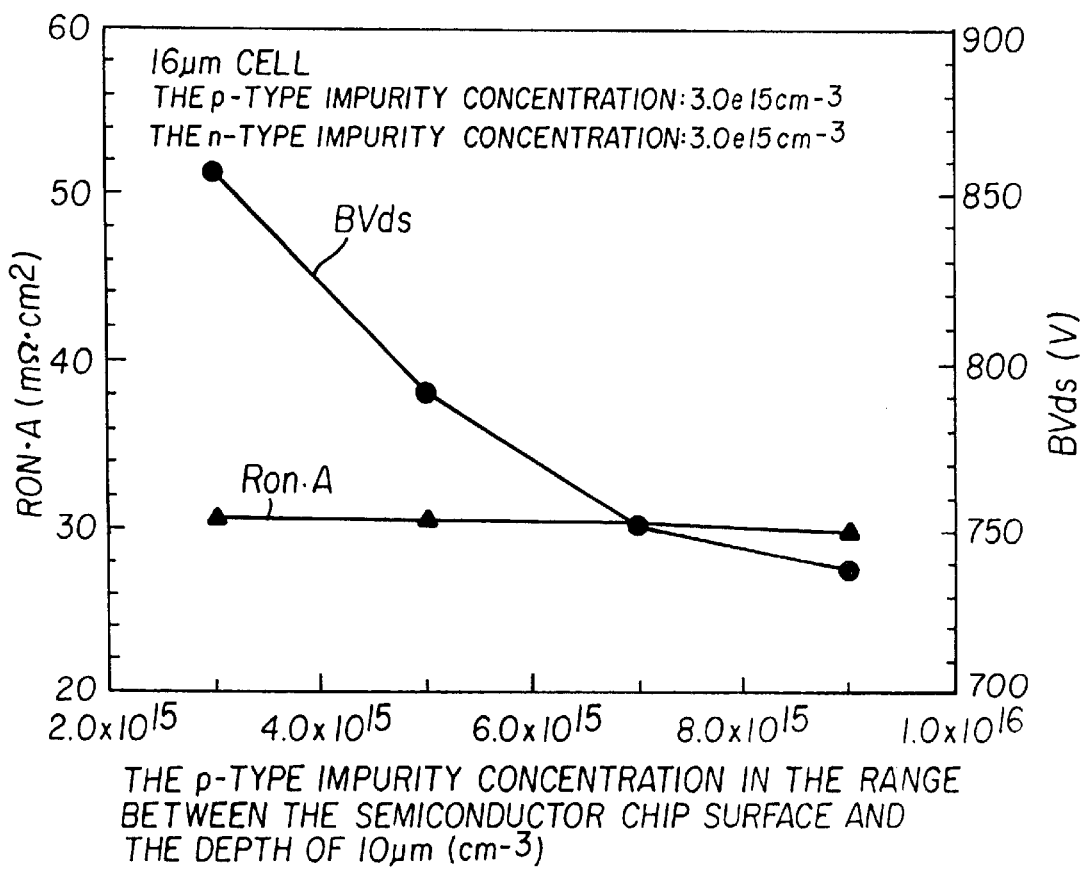
FIG. 4 is a pair of curves relating the breakdown voltage BVds and the on-resistance Ron.A of the MOSFET according to the first embodiment with the impurity concentration in the breakdown voltage limiter region.

FIG. 4 is a pair of curves relating the breakdown voltage BVds and the on-resistance Ron.A of the MOSFET according to the first embodiment with the impurity concentration in breakdown voltage limiter region 30. Since breakdown voltage limiter regions 30 determines the breakdown voltage of the MOSFET, the breakdown voltage decreases with increasing impurity concentration in breakdown voltage limiter regions 30. However, the on-resistance is almost constant, since the impurity concentration in n-type drift current path regions 22a is unchanged. Thus, the electric field beneath the gate insulation film is relaxed only at the sacrifice of certain lowering of the breakdown voltage. Since the lowering of the breakdown voltage is a relative decrement smaller than the increment of the breakdown voltage obtained by employing the alternating conductivity type layer, the breakdown voltage of the super-junction semiconductor device, that employs the alternating conductivity type layer including breakdown voltage limiter regions, is still higher than the breakdown voltage of the conventional semiconductor device.

Second Embodiment

Figure 5:
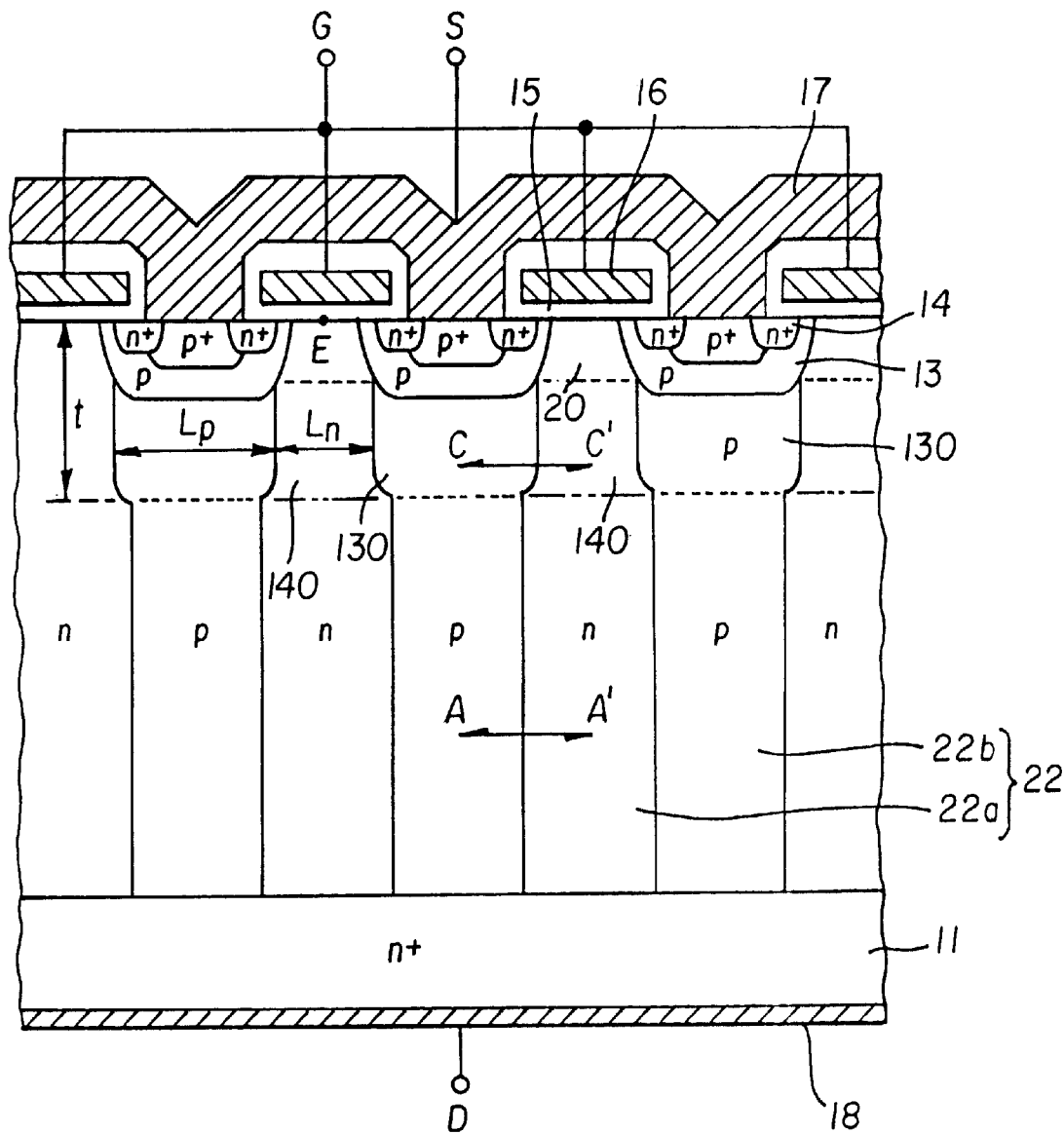
FIG. 5 is a cross sectional view of a vertical MOSFET according to a second embodiment of the invention.

FIG. 5 is a cross sectional view of a vertical MOSFET according to a second embodiment of the invention. In FIG. 5, the same reference numerals as used in FIG. 1 are used to designate the same constituent elements and their duplicated explanations are omitted for the sake of simplicity. Referring now to FIG. 5, although the impurity concentration in breakdown voltage limiter regions 130 is almost the same with the impurity concentration in adjacent opposite conductivity type regions 140, the width Lp of breakdown voltage limiter region 130 is wider that the width Ln of adjacent opposite conductivity type region 140.

Figure 6:
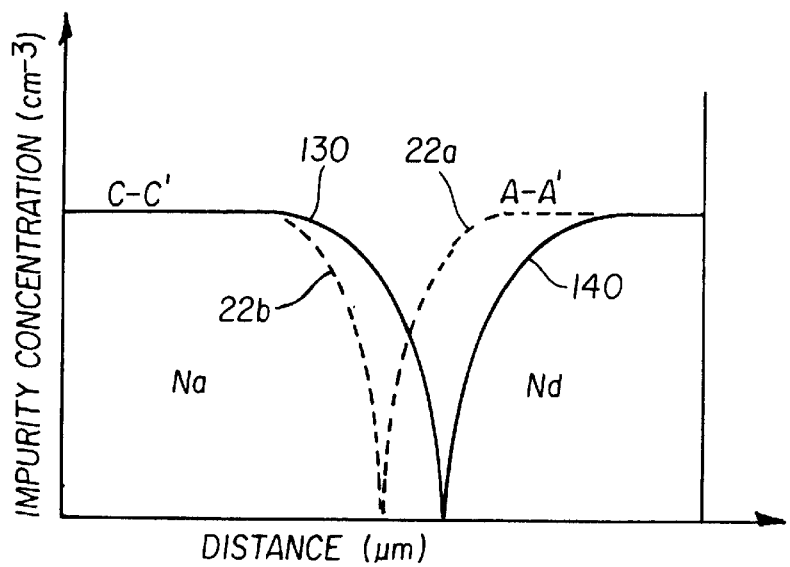
FIG. 6 shows the distribution profiles of the impurity concentration along the cross sections A-A' and C-C' of FIG. 5.

FIG. 6 shows the distribution profiles of the impurity concentration along A-A' and C-C' of FIG. 5. Since it is difficult to deplete the corner portion of wide breakdown voltage limiter region 130, the electric field at the central portion of wide breakdown voltage limiter region 130 reaches the critical value in advance of the electric field at the point E beneath the gate insulation film, and the surface electric field at the point E is relaxed. Breakdown hardly occurs in the vicinity of the point E, and hot carrier injection into the gate insulation film is prevented from causing. Therefore, the characteristics and the reliability of the active region in the super-junction semiconductor device are not impaired.

Figure 7:
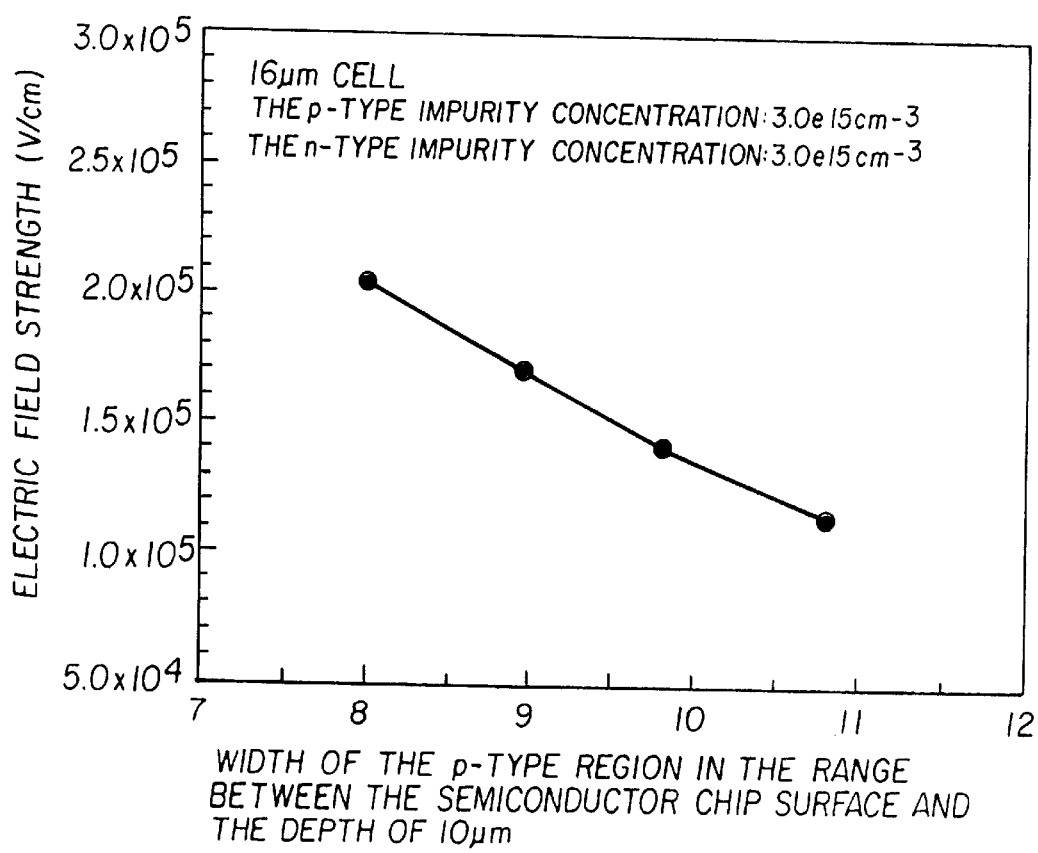
FIG. 7 is a graph simulating the relation between the electric field strength at the point E beneath the gate insulation film shown in FIG. 5 and the width Lp of the breakdown voltage limiter region.

FIG. 7 is a graph simulating the relation between the electric field strength at the point E beneath the gate insulation film shown in FIG. 5 and the width Lp of breakdown voltage limiter region 130. The pitch of repeating, thereat a pair of drift current path region 22a and p-type partition region 22b is repeated in alternating-conductivity-type drain drift layer 22 is 16 $\mu$m. The impurity concentrations in alternating-conductivity-type drain drift layer 22 are $3\times10^{15}$ cm$^{-3}$. The thickness of alternating-conductivity-type drain drift layer 22 is 50 $\mu$m. As FIG. 7 indicates, the electric field at the point E is $2.0\times10^5$ V/cm when the width Lp of breakdown voltage limiter region 130 is equal to the width (8 $\mu$m) of p-type partition region 22b. The electric field at the point E is relaxed more with increasing width Lp. The electric field at the point E is halved to $1.0\times10^5$ V/cm when the width Lp of breakdown voltage limiter region 130 is 11 $\mu$m. For relaxing the electric field at the point E, it is more effective to widen the width Lp of breakdown voltage limiter region 130 than to increase the impurity concentration thereof. In the range of the width Lp described in FIG. 7, the electric field at the point E does not saturate.

Figure 8:
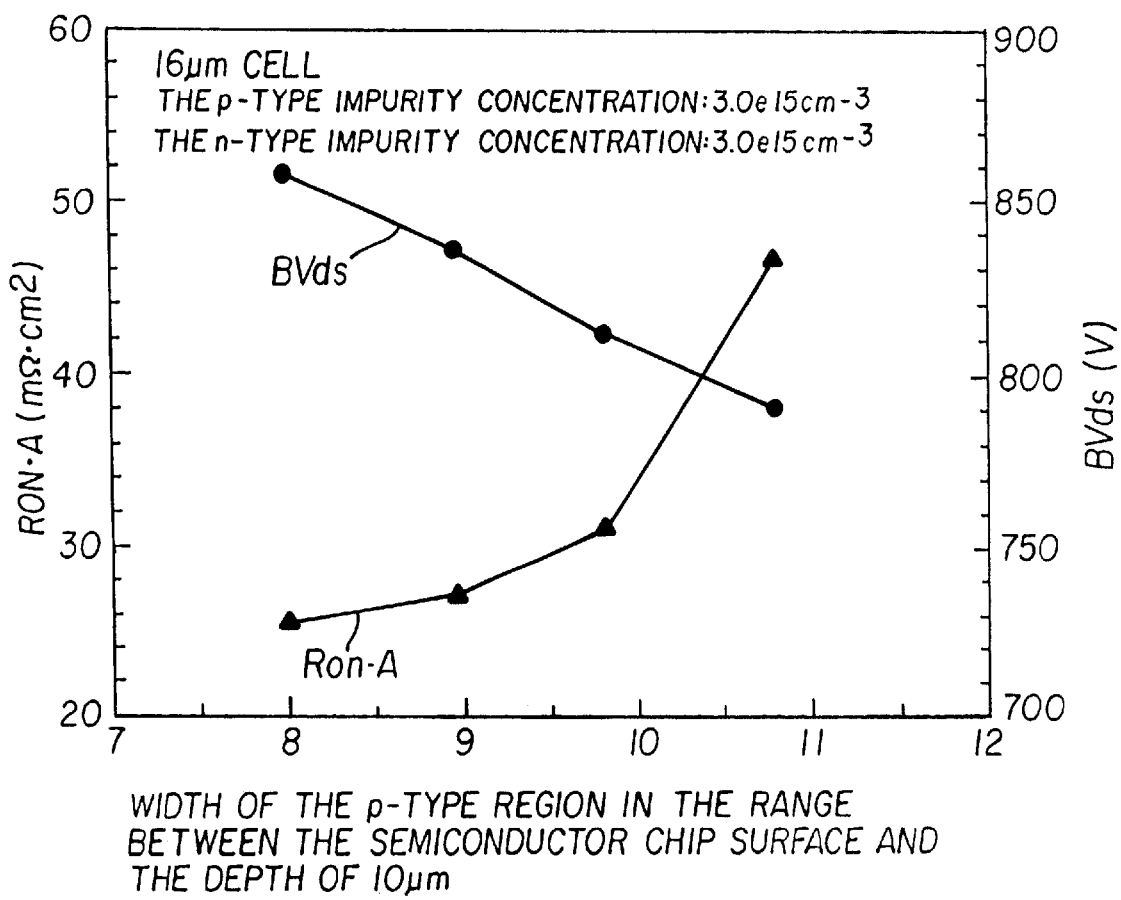
FIG. 8 is a pair of curves relating the breakdown voltage BVds and the on-resistance Ron.A of the MOSFET according to the second embodiment with the width Lp of the breakdown voltage limiter region.

FIG. 8 is a pair of curves relating the breakdown voltage BVds and the on-resistance Ron.A of the MOSFET according to the second embodiment with the width of breakdown voltage limiter region 130. The breakdown voltage BVds decreases almost linearly with increasing width of breakdown voltage limiter region 130. The on-resistance Ron.A increases with increasing width of breakdown voltage limiter region 130. The increase of the on-resistance is attributable to the high resistance of the narrow portion of n-type drift current path region 22a caused by the decrease of the width Ln of opposite conductivity type region 140 in association with the increase of the width Lp of breakdown voltage limiter region 130. As FIG. 8 indicates, the on-resistance increases sharply as the width Lp exceeds 10 $\mu$m. Therefore, it is preferable for the widening rate of the width Lp not to exceed 25%. For compensating the limited widening of breakdown voltage limiter region 130, it is preferable to increase the impurity concentration of breakdown voltage limiter region 130. To prevent the narrow portion of n-type drift current path region 22a from becoming highly resistive, it is preferable not to expand breakdown voltage limiter regions 13 so widely.

Third Embodiment

Figure 9:
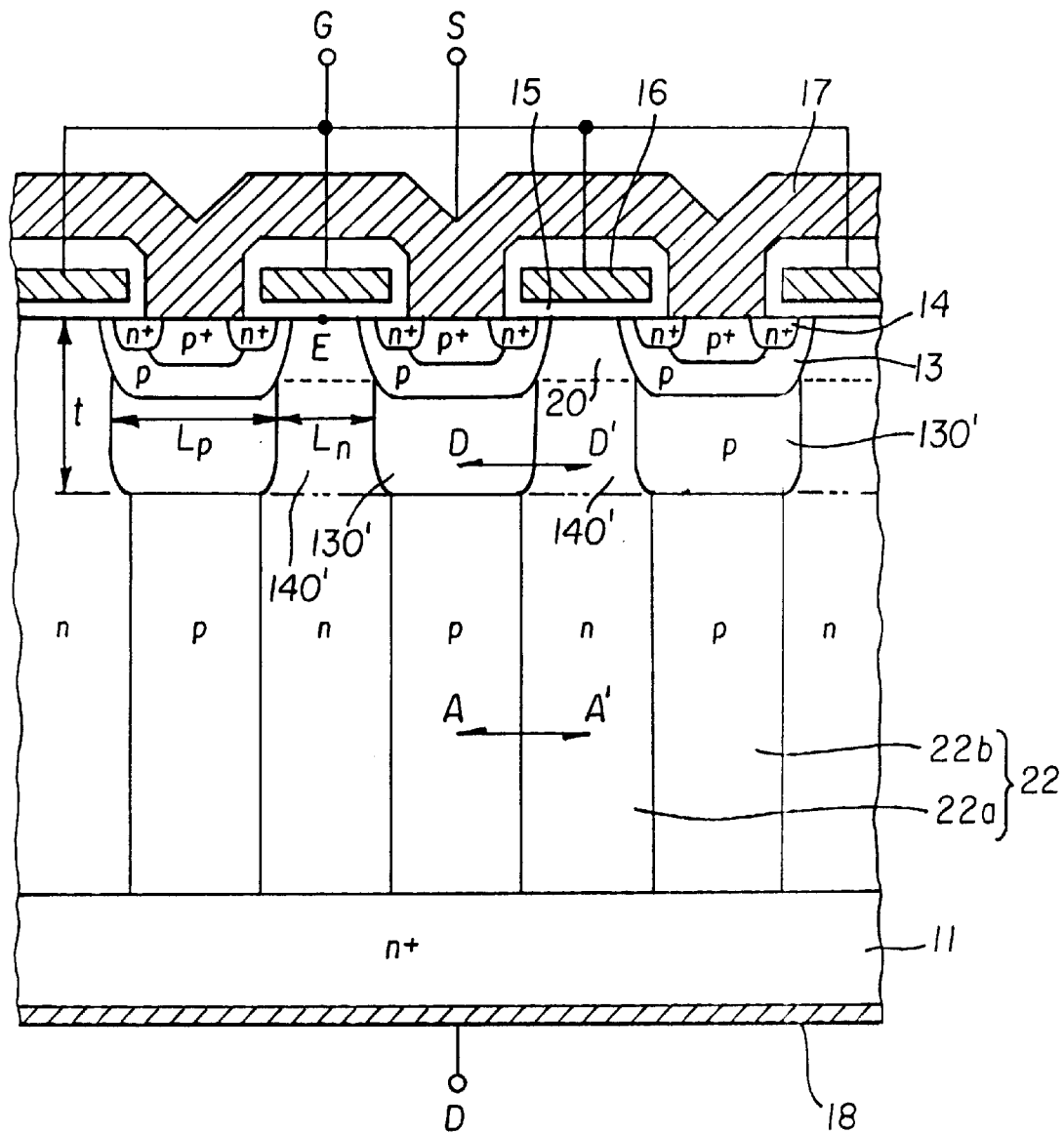
FIG. 9 is a cross sectional view of a vertical MOSFET according to a third embodiment of the invention.

FIG. 9 is a cross sectional view of a vertical MOSFET according to a third embodiment of the invention. In FIG. 9, the same reference numerals as used in FIG. 5 are used to designate the same constituent elements and their duplicated explanations are omitted for the sake of simplicity.

Figure 10:
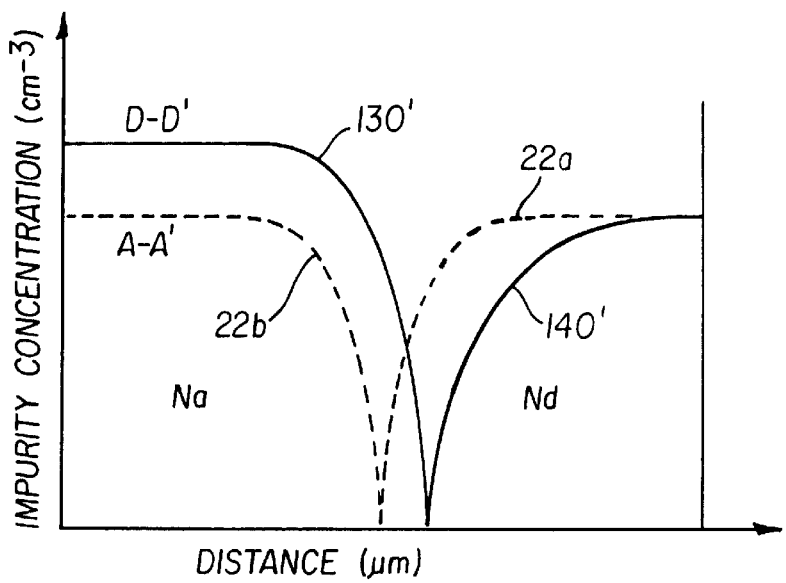
FIG. 10 shows the distribution profiles of the impurity concentration along the cross sections A-A' and D-D' of FIG. 9.

The MOSFET according to the third embodiment is different from the MOSFET according to the second embodiment in that the impurity concentration in breakdown voltage limiter regions 130' of the MOSFET according to the third embodiment is higher than the impurity concentration in opposite conductivity type regions 140'. FIG. 10 shows the distribution profiles of the impurity concentration along the cross sections A-A' and D-D' of FIG. 9.

Since it is difficult to deplete the heavily doped and wide breakdown voltage limiter region 130', the electric field at the central portion of wide breakdown voltage limiter region 130 reaches the critical value in advance of the electric field at the point E beneath the gate insulation film and, therefore, the surface electric field at the point E, is relaxed. Breakdown hardly occurs in the vicinity of the point E, and hot carrier injection into the gate insulation film is prevented from causing. Therefore, the characteristics and the reliability of the active region in the super-junction semiconductor device are not impaired.

Figure 11:
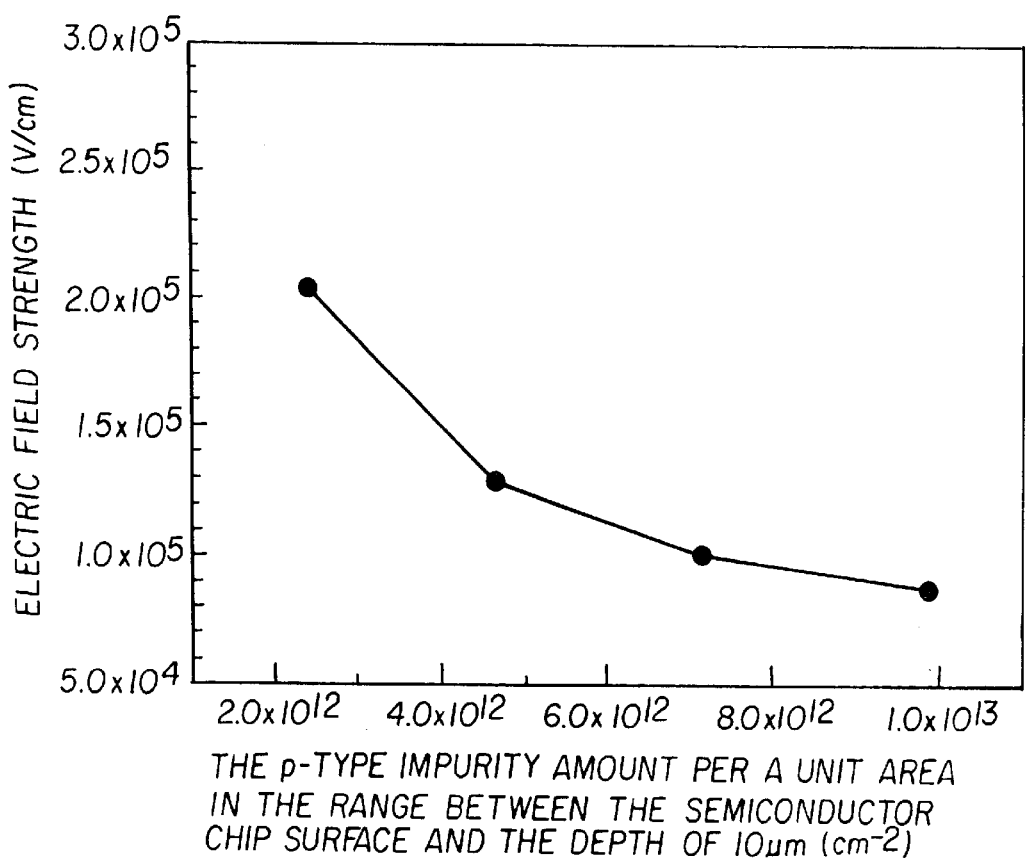
FIG. 11 is a graph simulating the relation between the electric field strength at the point E beneath the gate insulation film and the impurity amount, obtained by multiplying the impurity concentration and the width Lp of the breakdown voltage limiter region.

FIG. 11 is a graph simulating the relation between the electric field strength at the point E beneath the gate insulation film and the impurity amount, obtained by multiplying the impurity concentration and the width Lp, of breakdown voltage limiter region 130' (the range between the semiconductor chip surface and the depth of 10 $\mu$m). The pitch of repeating, thereat a pair of drift current path region 22a and p-type partition region 22b is repeated in alternating-conductivity-type drain drift layer 22 is 16 $\mu$m. The impurity concentrations in alternating-conductivity-type drain drift layer 22 are $3 \times 10^{15}$ cm$^{-3}$. The thickness of alternating-conductivity-type drain drift layer 22 is 50 $\mu$m. As FIG. 11 indicates, the electric field at the point E is relaxed more according to the third embodiment than according to the first embodiment or the second embodiment, since both the electric field relaxation by the increased impurity concentration according to the first embodiment and the electric field relaxation by the widened width Lp according to the second embodiment are effected additionally according to the third embodiment.

Figure 12:
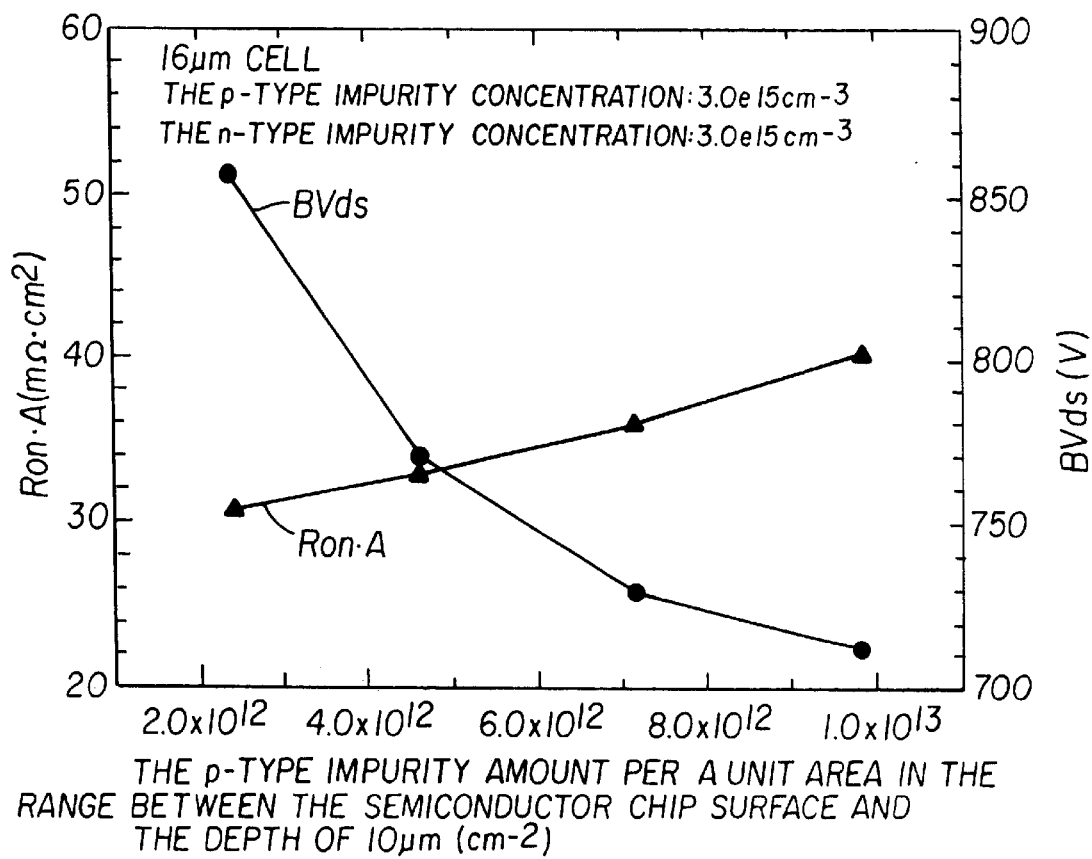
FIG. 12 is a pair of curves relating the breakdown voltage BVds and the on-resistance Ron.A of the MOSFET according to the third embodiment with the impurity amount in the breakdown voltage limiter region.

FIG. 12 is a pair of curves relating the breakdown voltage BVds and the on-resistance Ron.A of the MOSFET according to the third embodiment with the impurity amount in the breakdown voltage limiter region. The breakdown voltage lowers sharply in the region, wherein the impurity amount is low. The breakdown voltage lowers slowly or rather saturates in the region, wherein the impurity amount is high. The on-resistance increases with increasing impurity amount more slowly according to the third embodiment than according to the second embodiment. Therefore, for lowering the electric field strength at the point E and for realizing low on-resistance, it is preferable to widen the width Lp slightly (at the widening rate of 25% or less) and to increase the impurity concentration.

Fourth Embodiment

Figure 13:
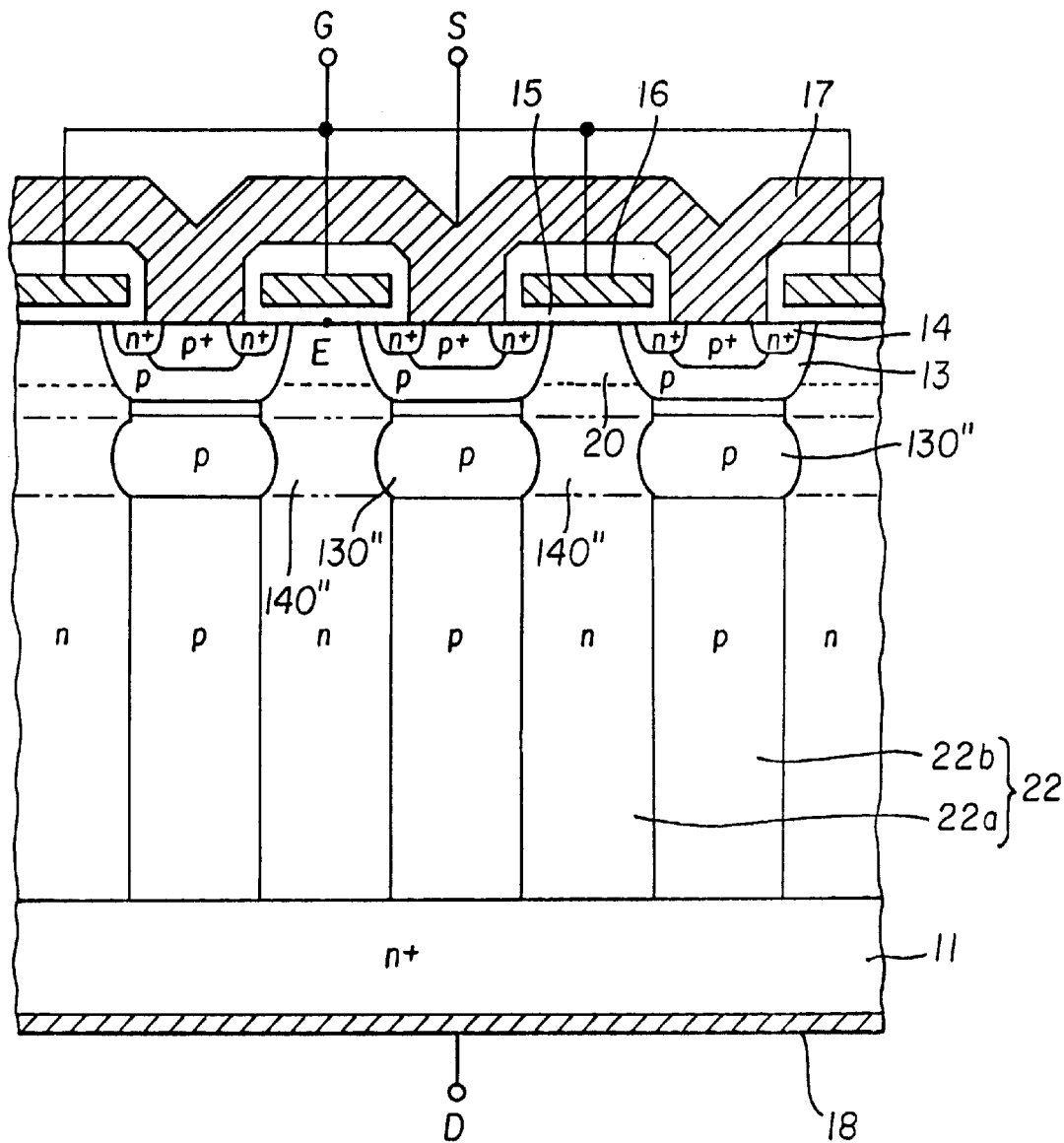
FIG. 13 is a cross sectional view of a vertical MOSFET according to a fourth embodiment of the invention.
Figure 14:
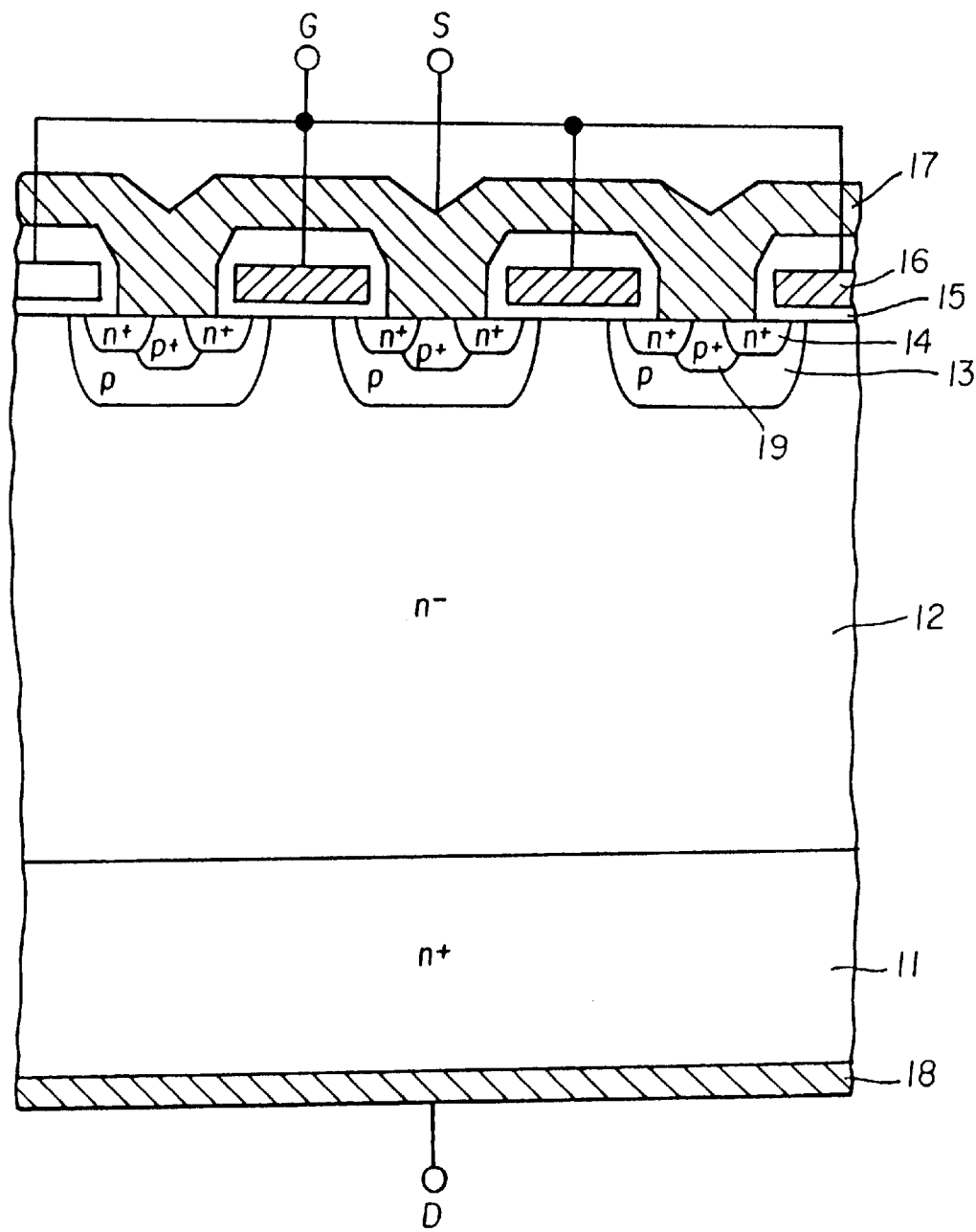
FIG. 14 is a cross sectional view of a conventional planar-type n-channel vertical MOSFET (vertical double-diffused MOSFET)

FIG. 13 is a cross sectional view of a vertical MOSFET according to a fourth embodiment of the invention. In FIG. 13, the same reference numerals as used in FIG. 9 are used to designate the same constituent elements and their duplicated explanations are omitted for the sake of simplicity.

The MOSFET according to the fourth embodiment has breakage voltage limiter regions 130" and opposite conductivity regions 140" similar to the corresponding regions 130' and 140' of the MOSFET according to the third embodiment, but is different therefrom in that the breakdown voltage limiter regions 130" are spaced apart from p-type base regions 13 in the fourth embodiment. Although breakdown is caused in the corner portions of breakdown voltage limiter regions 130", hot carrier injection may be prevented from causing more effectively as breakdown voltage limiter region 130" is spaced apart more widely from the point E beneath the gate insulation film. Breakdown voltage limiter region 130" may be formed in any other locations in partition region 22b such as the location on the side of n$^+$-type drain layer 11 and the location in contact with n$^+$-type drain layer 11.

Although the invention has been explained in connection with the MOSFET's, the invention is also applicable to other super-junction devices such as: Schottky barrier diodes, IGBT's, FWD's, and bipolar transistors as effectively as to the MOSFET's. The invention is also applicable to lateral super-junction devices and super-junction devices including: an alternating conductivity type layer formed of n-type regions and p-type regions arranged alternately and extending in parallel or obliquely to the major surface of the semiconductor chip.

As explained above, the super-junction semiconductor device according to the invention includes an active region and an alternating conductivity type layer including breakdown voltage limiter regions, the electric field thereof reaches the critical value in advance to the electric field on the first major surface side of the active region.

The super-junction semiconductor device according to the invention exhibits the following effects:

Since breakdown is caused in the breakdown voltage limiter regions, the electric field thereof reaches the critical value in advance of the electric field beneath the first major surface, the electric field beneath the first major surface is low enough to prevent hot carrier injection into the insulation film on the side of the first major surface from causing. Therefore, the characteristics and the reliability of the super-junction semiconductor device, that exhibits a high breakdown voltage and a high current capacity, are not impaired.

When the breakdown voltage limiter regions are of the second conductivity type and formed in their respective partition regions, the breakdown voltage limiter regions prevent the hot carriers from hitting the insulation layers more effectively.

The performance of the breakdown voltage limiter region is defined by the impurity amount therein, that is a product of the dimensions (volume) and the impurity concentration thereof. The impurity amount of the breakdown voltage limiter region is set at a value higher than the impurity amount of the opposite conductivity type region in the adjacent drift current path region. When the width of the breakdown voltage limiter region is equal to the width of the opposite conductivity type region, the on-resistance is prevented from increasing by setting the impurity concentration in the breakdown voltage limiter region at a value higher than the impurity concentration in the opposite conductivity type region.

What is claimed is:

1. A semiconductor device comprising:
   a semiconductor chip having a first major surface and a second major surface facing opposite to the first major surface;
   a first main electrode on the first major surface;
   a second main electrode on the second major surface;
   an active region in electrical contact with the first main electrode; and
   a layer with low electrical resistance in electrical contact with the second main electrode;
   an alternating-conductivity-type drain drift layer between the active region and the layer with low electrical resistance;
   wherein the alternating-conductivity-type drain drift layer comprises first semiconductor regions of a first conductivity type and second semiconductor regions of a second conductivity type;
   wherein the first semiconductor regions and the second semiconductor regions are arranged alternately with each other; and
   wherein the alternating-conductivity-type drain drift layer further includes breakdown voltage limiter regions of the second conductivity type in the second semiconductor regions having a higher impurity concentration than adjacent portions of the first conductivity type in the first semiconductor regions.

2. The semiconductor device according to claim 1, wherein an impurity concentration in the breakdown voltage limiter region is higher than the impurity concentration of the first conductivity type in the first semiconductor region.

3. The semiconductor device according to claim 1, wherein the width of the breakdown voltage limiter region is wider than the width of the first semiconductor region.

4. The semiconductor device according to claim 1, wherein each of the first and second semiconductor regions forms a stripped area, the first and the second semiconductor regions are laminated of the striped areas of the first semiconductor regions, and the striped areas of the second semiconductor regions arranged alternately.

5. The semiconductor device according to claim 1, wherein the first semiconductor regions and the second semiconductor regions each are column shaped and arranged at respective lattice points thereof.

6. The semiconductor device according to claim 1, wherein the first semiconductor regions or the second semiconductor regions are shaped with walls forming a honeycomb.

7. The semiconductor device according to claim 1, wherein the active region constitutes a double-diffused MOSFET structure.

8. The semiconductor device according to claim 1, wherein the first semiconductor regions and the second semiconductor regions extend vertically and are arranged alternately side by side.

9. The semiconductor device according to claim 1, wherein an impurity concentration in the breakdown voltage limiter regions in the second semiconductor regions is higher than the impurity concentration of remaining portions of the second semiconductor regions.

10. The semiconductor device according to claim 1, wherein the width of the breakdown voltage limiter regions is wider than remaining portions of the second semiconductor regions.

* * * * *